US012604136B2

(12) United States Patent
Ji et al.

(10) Patent No.: US 12,604,136 B2
(45) Date of Patent: Apr. 14, 2026

(54) ASSEMBLED SCREEN UNIT AND DISPLAY MODULE

(71) Applicant: BOE TECHNOLOGY GROUP CO., LTD., Beijing (CN)

(72) Inventors: Yaqian Ji, Beijing (CN); Xudong Quan, Beijing (CN); Lei Wang, Beijing (CN); Mingkun Yang, Beijing (CN); Yonggang Cao, Beijing (CN); Yanling Han, Beijing (CN); Peixiao Li, Beijing (CN); Yue Gou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 155 days.

(21) Appl. No.: 18/578,442

(22) PCT Filed: Aug. 5, 2022

(86) PCT No.: PCT/CN2022/110500
§ 371 (c)(1),
(2) Date: Jan. 11, 2024

(87) PCT Pub. No.: WO2023/016361
PCT Pub. Date: Feb. 16, 2023

(65) Prior Publication Data
US 2024/0323595 A1 Sep. 26, 2024

(30) Foreign Application Priority Data
Aug. 12, 2021 (CN) .......................... 202110926207.1

(51) Int. Cl.
H04R 1/28 (2006.01)
H04R 1/02 (2006.01)
H05K 5/02 (2006.01)

(52) U.S. Cl.
CPC ........... H04R 1/2896 (2013.01); H04R 1/025 (2013.01); H05K 5/0217 (2013.01); H04R 2400/11 (2013.01); H04R 2499/15 (2013.01)

(58) Field of Classification Search
CPC .. H04R 1/2896; H04R 1/025; H04R 2400/11; H04R 2499/15; H04R 7/20; H04R 7/045; H04R 9/06; H04R 2440/05; H05K 5/0217
See application file for complete search history.

(56) References Cited

U.S. PATENT DOCUMENTS

| | | | | |
|---|---|---|---|---|
| 3,603,427 A | * | 9/1971 | Sotome | H04R 7/02 |
| | | | | 181/166 |
| 10,782,731 B1 | * | 9/2020 | Starnes | H04R 7/18 |

(Continued)

FOREIGN PATENT DOCUMENTS

| | | |
|---|---|---|
| CN | 111629305 A | 9/2020 |
| CN | 112188371 A | 1/2021 |

*Primary Examiner* — Sinh Tran
(74) *Attorney, Agent, or Firm* — HOUTTEMAN LAW LLC

(57) ABSTRACT

Provided in the embodiments of the present disclosure is an assembled screen unit, including a display panel, a frame, a sound-production stimulation unit, and a supporting structure; the supporting structure is configured to support the sound-production stimulation unit; the back side of the display panel includes a central region and an edge region; the sound-production stimulation unit is in contact with the central region; the frame is configured to support the display panel; the frame includes a first sub-portion and a second sub-portion; and a first vibration isolation portion is provided between the first sub-portion and the display panel; a second vibration isolation portion is provided between the second sub-portion and the display panel; and the first vibration isolation portion has a thickness less than the second vibration isolation portion.

20 Claims, 11 Drawing Sheets

(56)  References Cited

U.S. PATENT DOCUMENTS

| | | | |
|---|---|---|---|
| 2002/0018576 A1* | 2/2002 | Shima .................... | H04R 1/025 |
| | | | 381/396 |
| 2006/0140437 A1 | 6/2006 | Watanabe et al. | |
| 2017/0280215 A1* | 9/2017 | Lee ........................ | H04R 7/045 |
| 2019/0037164 A1 | 1/2019 | Kim et al. | |
| 2019/0037165 A1 | 1/2019 | Lee et al. | |
| 2020/0280796 A1* | 9/2020 | Lee ........................... | H04S 3/00 |
| 2021/0006879 A1* | 1/2021 | Kim .................... | H04R 1/2803 |
| 2022/0006478 A1* | 1/2022 | Yu ........................... | H04M 1/03 |

\* cited by examiner

ASSEMBLED SCREEN UNIT AND DISPLAY MODULE

TECHNICAL FIELD

Embodiments of the present disclosure belong to the field of display technology, and specifically relate to an assembled screen unit and a display module.

BACKGROUND

An audible display screen can output sound from the display screen itself, thereby realizing coincidence of sound and image, and enhancing the audio-visual experience of the audience.

SUMMARY

Embodiments of the present disclosure provide an assembled screen unit and a display module.

In a first aspect, an embodiment of the present disclosure provides an assembled screen unit, including a display panel, a frame, a sound-production stimulation unit, and a supporting structure, wherein the frame, the sound-production stimulation unit, and the supporting structure are located on a back side of the display panel;

the supporting structure is located on a side of the sound-production stimulation unit away from the display panel, and the supporting structure is configured to support the sound-production stimulation unit;

the back side of the display panel includes a central region and an edge region;

the sound-production stimulation unit is in contact with the central region, and the sound-production stimulation unit is configured to stimulate vibration of the display panel to produce sound; and an orthographic projection of the frame on the back side of the display panel is located in the edge region, and the frame is configured to support the display panel;

wherein the frame includes a first sub-portion and a second sub-portion, and an orthographic projection of the second sub-portion on the back side of the display panel is closer to the central region than an orthographic projection of the first sub-portion on the back side of the display panel; and a first vibration isolation portion is provided between the first sub-portion and the display panel; a second vibration isolation portion is provided between the second sub-portion and the display panel; and the first vibration isolation portion has a thickness less than the second vibration isolation portion.

In some embodiments, the second sub-portion is formed by extending out from a side of the first sub-portion close to the central region in a direction approaching the central region; and a gap between a side of the second sub-portion close to the display panel and the edge region is greater than a gap between the side of the first sub-portion close to the display panel and the edge region.

In some embodiments, the second sub-portion is formed by extending out from a side of the first sub-portion close to the central region first in a direction approaching the central region, then in a direction away from the display panel, and then in a direction approaching the central region:

a gap between a side of the second sub-portion close to the display panel and the edge region is greater than a gap between the side of the first sub-portion close to the display panel and the edge region.

In some embodiments, the second sub-portion is formed by first extending out partially from a side of the first sub-portion facing away from the display panel in a direction away from the display panel, and then extending in a direction approaching the central region; and a gap between a side of the second sub-portion close to the display panel and the edge region is greater than a gap between the side of the first sub-portion close to the display panel and the edge region.

In some embodiments, the second sub-portion is located on a side of the first sub-portion facing away from the display panel, the orthographic projections of the second sub-portion and the first sub-portion on the back side of the display panel are partially overlapped, and the second sub-portion and the first sub-portion are connected with each other at an overlap position of the orthographic projections of the second sub-portion and the first sub-portion; and a third vibration isolation portion is further provided between the second sub-portion and the first sub-portion.

In some embodiments, a thickness of the second vibration isolation portion is equal to a sum of thicknesses of the first vibration isolation portion, the first sub-portion, and the third vibration isolation portion.

In some embodiments, the first vibration isolation portion is separated from the second vibration isolation portion by a gap of 1 mm or more:

or, the first vibration isolation portion and the second vibration isolation portion are in contact with each other to form an integral structure.

In some embodiments, the orthographic projection of the first sub-portion on the back side of the display panel forms a first closed loop:

an orthographic projection of the second sub-portion on the back side of the display panel forms a second closed loop;

the second closed loop surrounds a periphery of the central region: the first closed loop surrounds a periphery of the second closed loop;

the second closed loop is fully abutted against the first closed loop:

or, the second closed loop is abutted against the first closed loop at peripheral local positions, and a hollowed-out region is formed in a non-abutted peripheral region between the second closed loop and the first closed loop.

In some embodiments, a vibration frequency of the display panel is greater than $\sqrt{2}$ times of a natural frequency of the second vibration isolation portion.

In some embodiments, the assembled screen unit further includes an acoustic cavity on a side of the frame facing away from the display panel, and the acoustic cavity is connected to the second sub-portion: wherein the acoustic cavity is fastened to the back side of the display panel in a closed manner, and an orthographic projection of the acoustic cavity on the back side of the display panel covers the central region.

In some embodiments, the supporting structure is fastened to the back side of the display panel in a closed manner; and the supporting structure is reused as an acoustic cavity.

In some embodiments, the supporting structure is connected to the second sub-portion through a fourth vibration isolation portion; and the fourth vibration isolation portion is located between the supporting structure and the second sub-portion.

In some embodiments, the supporting structure is connected to the second sub-portion through a fourth vibration isolation portion; and the fourth vibration isolation portion is located between the supporting structure and the second sub-portion.

In some embodiments, the supporting structure includes a main body portion and a connecting portion, the main body portion has a strip-shaped structure, and the connecting portion is connected to the second sub-portion:

a width of the main body portion is smaller than a width of the central region in that width direction; and the supporting structure is located in a cavity formed by the acoustic cavity and the display panel fastened together.

In some embodiments, the assembled screen unit further includes a case on a side of the frame facing away from the display panel, the case is connected to a side of the first sub-portion facing away from the display panel, and the case is fastened to the back side of the display panel in a closed manner; wherein both the acoustic cavity and the supporting structure are located in a cavity formed by the case and the display panel fastened together.

In some embodiments, the assembled screen unit further includes a case on a side of the frame facing away from the display panel, the case is connected to a side of the first sub-portion facing away from the display panel, and the case is fastened to the back side of the display panel in a closed manner; wherein the supporting structure is located in a cavity formed by the case and the display panel fastened together.

An embodiment of the present disclosure further provides a display module, including a plurality of assembled screen units as described above, wherein the plurality of assembled screen units are assembled with each other.

BRIEF DESCRIPTION OF DRAWINGS

Accompanying drawings are provided for further understanding of the embodiments of the present disclosure and constitute a part of the specification. Hereinafter, these drawings are intended to explain the present disclosure together with the following embodiments, but should not be considered as a limitation to the present disclosure. The above and other features and advantages will become more apparent to those skilled in the art by describing in detail exemplary embodiments thereof with reference to the attached drawings, in which.

Figure 1:
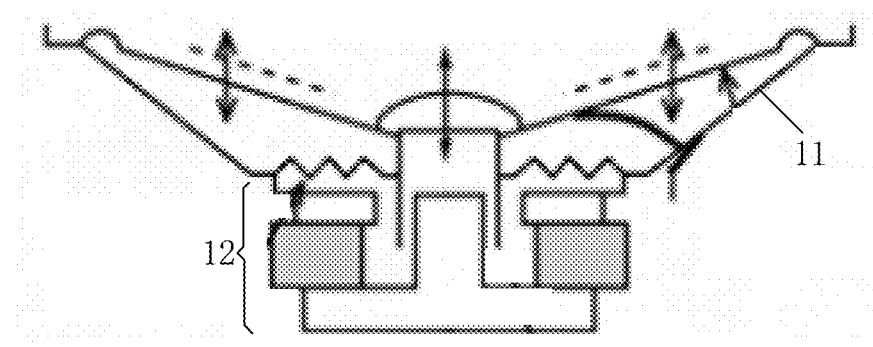
FIG. 1 is a schematic structural diagram of a flat panel speaker with a conical diaphragm in the existing art.

REFERENCE SIGNS 1. display panel; 101. central region; 102. edge region; 2. frame; 21. first sub-portion; 22. second sub-portion; 3. sound-production stimulation unit; 4. first vibration isolation portion; 5. second vibration isolation portion; 6. case; 7. third vibration isolation portion; 8. acoustic cavity; 9. supporting structure; 91. main body portion; 92. connecting portion; 10. fourth vibration isolation portion; 11. conical diaphragm; 12. driver unit; 13. assembled unit; 14. foam tape; 15. aluminum frame; 16. iron nail; and 17. magnet.

DETAIL DESCRIPTION OF EMBODIMENTS

In order to make those skilled in the art better understand the technical solutions in the embodiments of the present disclosure, the assembled screen unit and the display module provided in the embodiments of the present disclosure will be described in further detail below with reference to the accompanying drawings and specific implementations.

Embodiments of the present disclosure will be described more sufficiently below with reference to the accompanying drawings, which may be embodied in different forms and should not be construed as being limited to the embodiments set forth herein. Rather, these embodiments are provided so that the present disclosure will be thorough and complete, and will fully convey the scope of the present disclosure to those skilled in the art.

The embodiments of the present disclosure are not limited to the embodiments shown in the drawings, but further include modifications of configurations formed based on a manufacturing process. Thus, the regions illustrated in the figures have schematic properties, and the shapes of the regions shown in the figures illustrate specific shapes of regions, but are not intended to be limitative.

Figure 2:
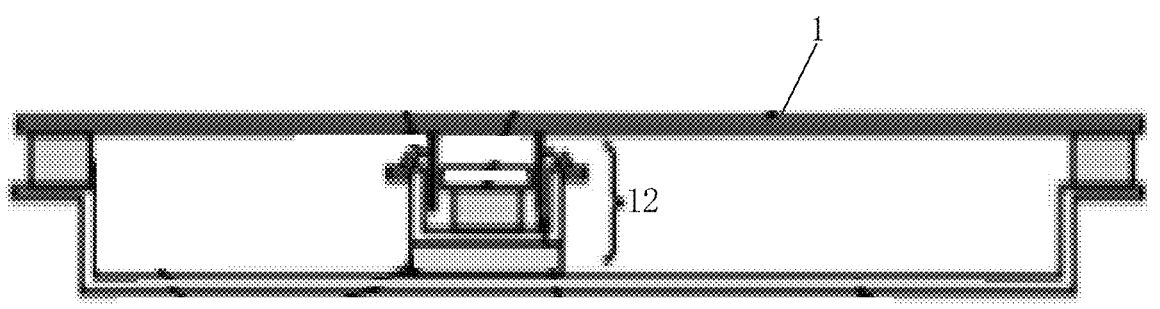
FIG. 2 is a schematic structural diagram of a flat panel speaker in the existing art.

A flat panel speaker is based on a sound production vibration principle as follows: a driver is adhered to a special flat sheet and fixed at a special designated position on the flat sheet, and once powered on, the driver drives the flat sheet to generate wave mode vibration and propagate sound. Referring to FIGS. 1 and 2, the display screen sound production technology is based on the principle of the flat panel speaker, in which a screen (i.e., a display panel 1 of a display apparatus) is used to replace a conical diaphragm 11 in the conventional flat panel speaker, and a driver unit 12 drives a vibration plate (i.e., the display panel 1) to vibrate and produce sound.

Figure 3:
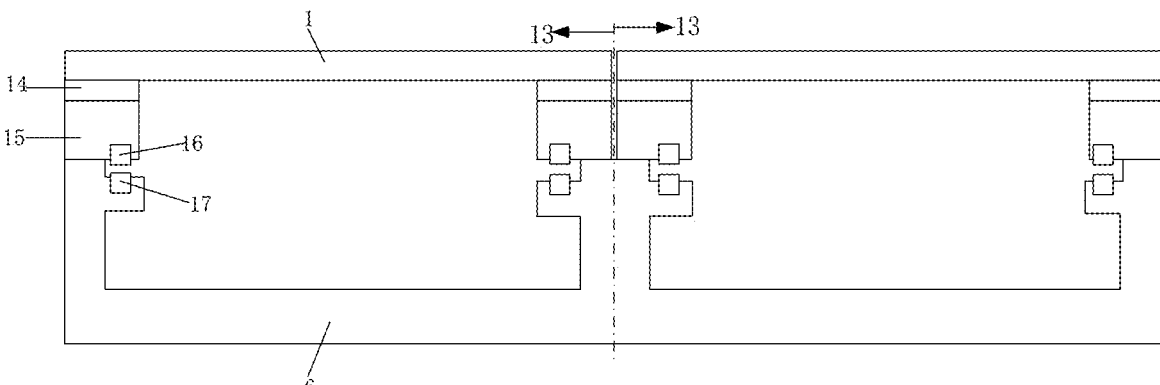
FIG. 3 is a schematic diagram of an assembled display apparatus in the existing art.
Figure 4:
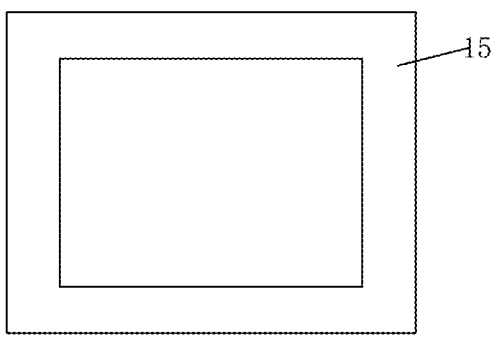
FIG. 4 is a schematic structural top view of an aluminum frame shown in FIG. 3.

Referring to FIGS. 3 and 4, a assembled display apparatus with a conventional audible screen generally has a case structure to implement assembly of assembled units 13. An edge region of the display panel 1 in the display apparatus is bonded to an aluminum frame 15 through a foam tape 14. An iron nail 16 is provided on the aluminum frame 15. A magnet 17 is provided on the aluminum case 6. The magnet 17 and the iron nail 16 are attracted to each other under magnetic attraction. To ensure overall flatness of the assembled display panel 1, the foam tape 14 is typically very thin. To realize the sound production function of the display panel, a sound-production stimulation unit is attached to a back side of the display panel and drives the display panel to vibrate to radiate sound.

However, on the one hand, the vibration of the display panel will be transmitted to the aluminum frame 15 and the case 6 through the edge region, causing vibration of the case 6 and generating abnormal sound. On the other hand, when the display panel 1 is vibrated to produce sound, the aluminum case 6 becomes a back cavity of the sound production device, in which air will be pushed by the display panel 1 to vibrate, and due to little damping in the aluminum case 6, distortion and sound stain are likely to occur in the aluminum back cavity, influencing the sound quality and subjective experience of the audience. A conventional method for solving the above problem is to use a foam tape of a certain thickness to weaken the transmission of vibration from the display panel to the aluminum frame and the case. A thicker vibration isolation element, such as the common foam tape, typically leads to a better vibration isolation effect. However, a too thick vibration isolation element may affect overall flatness of the assembled display panel. Therefore, this conventional method is not suitable for applications with high flatness requirements such as assembled screens.

To solve the above problems of abnormal sound, distortion and sound stain caused by the vibration transmission from the display panel to the aluminum frame and the case, referring to FIGS. 5 to 8, an embodiment of the present disclosure provides an assembled screen unit including a display panel 1, a frame 2, a sound-production stimulation unit 3, and a supporting structure 9. The frame 2, the sound-production stimulation unit 3 and the supporting structure 9 are located on a back side of the display panel 1. The supporting structure 9 is located on a side of the sound-production stimulation unit 3 away from the display panel 1, and configured to support the sound-production stimulation unit 3. The back side of the display panel 1 includes a central region 101 and an edge region 102. The sound-production stimulation unit 3 is in contact with the central region 101 of the display panel 1, and configured to stimulate vibration of the display panel 1 to produce sound . . . . An orthographic projection of the frame 2 on the back side of the display panel 1 is located in the edge region 102 of the display panel 1. The frame 2 is configured to support the display panel 1. The frame 2 includes a first sub-portion 21 and a second sub-portion 22. An orthographic projection of the second sub-portion 22 on the back side of the display panel 1 is closer to the central region 101 of the display panel 1 than an orthographic projection of the first sub-portion 21 on the back side of the display panel 1. A first vibration isolation portion 4 is provided between the first sub-portion 21 and the display panel 1. A second vibration isolation portion 5 is provided between the second sub-portion 22 and the display panel 1. The first vibration isolation portion 4 has a thickness less than the second vibration isolation portion 5.

The display panel 1 has a display side and a back side. The back side of the display panel 1 refers to a side of the display panel 1 opposite to the display side. The thicknesses of the first vibration isolation portion 4 and the second vibration isolation portion 5 refer to dimensions of the first vibration isolation portion 4 and the second vibration isolation portion 5 in a direction away from the display panel 1, respectively. The edge region 102 of the display panel 1 includes a first border region S1 and a second border region S2. The second border region S2 and the first border region S1 are arranged sequentially away from the central region 101 of the display panel 1. The first sub-portion 21 and the first vibration isolation portion 4 provide support for the first border region S1. The second sub-portion 22 and the second vibration isolation portion 5 provide support for the second border region S2. The sound-production stimulation unit 3 includes a basin stand, a driver unit and a vibration unit. The basin stand is configured for supporting and bearing. The driver unit is a magnet. The vibration unit is a voice coil. The voice coil is in contact with the central region 101 of the display panel 1. The magnet is connected to the voice coil through a conducting wire. When the magnet is energized and produces a magnetic field, the magnetic field drives the voice coil to vibrate and transmit the vibration to the display panel 1, so that the display panel 1 is vibrated and produces sound.

In some embodiments, the first vibration isolation portion 4 has a thickness in a range of 0.2 to 2 mm; and the second vibration isolation portion 5 has a thickness in a range of 2 to 10 mm. Surfaces of the first vibration isolation portion 4 and the second vibration isolation portion 5 that are in contact with the display panel 1 are flush.

Figure 6:
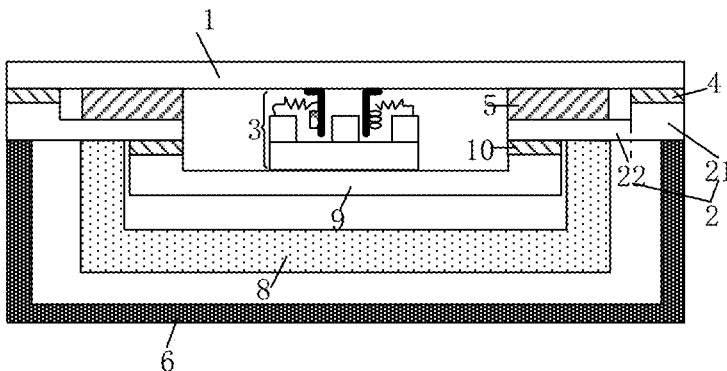
FIG. 6 is a schematic structural sectional view of another assembled screen unit according to an embodiment of the present disclosure.
Figure 7:
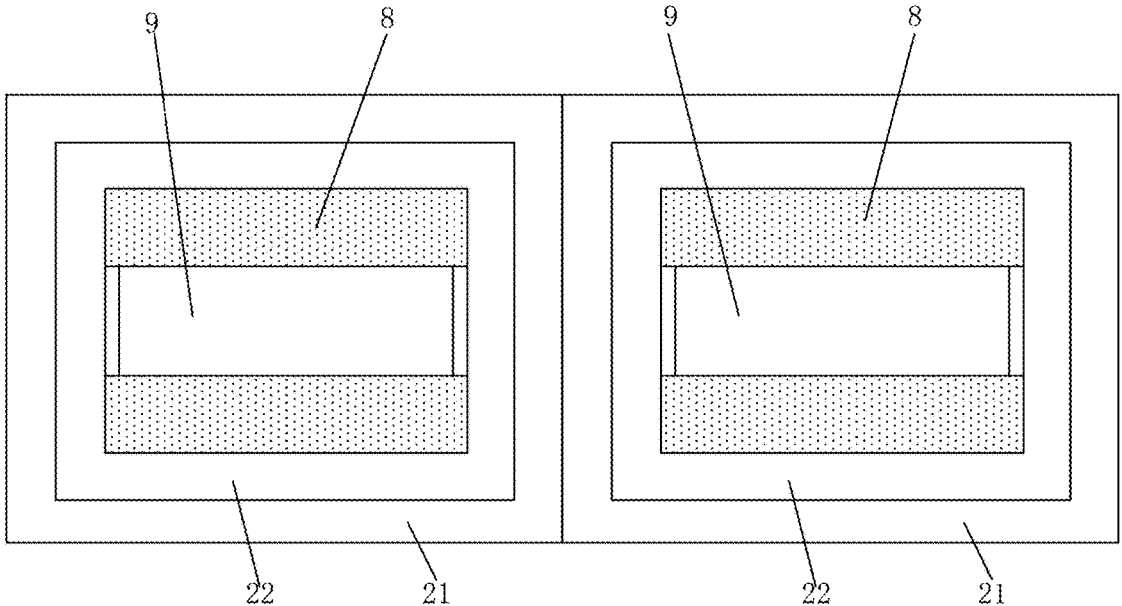
FIG. 7 is a schematic top view showing an assembled structure of an assembled screen unit according to an embodiment of the present disclosure.
Figure 8:
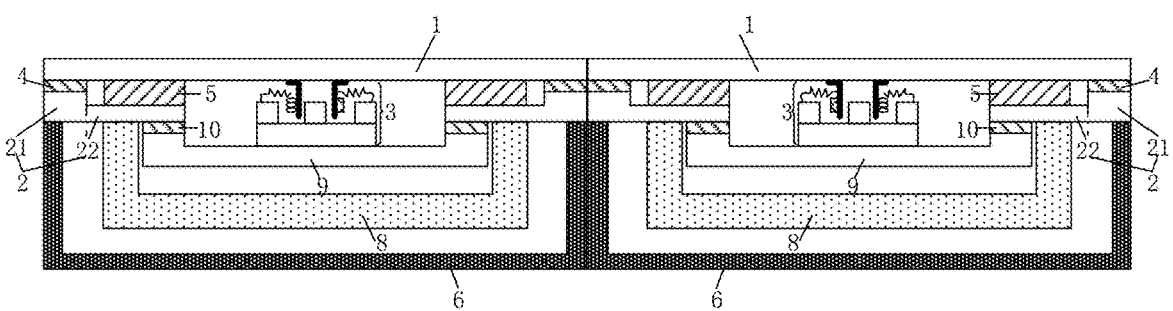
FIG. 8 is a schematic sectional view of the assembled structure taken along section line AA in FIG. 7.

In some embodiments, referring to FIG. 6, the assembled screen unit further includes a case 6 on a side of the frame 2 facing away from the display panel 1. The case 6 is connected to a side of the first sub-portion 21 facing away from the display panel 1. The case 6 is fastened to the back side of the display panel 1 in a closed manner. The case 6 is configured to provide support for the frame 2 and the display panel 1, so as to facilitate assembly of a plurality of assembled screen units.

In some embodiments, the frame 2 and the case 6 are made of a material including aluminum. The aluminum frame 2 and case 6 have certain strength on the one hand, while is lightweight on the other hand, which can ensure not only firm and stable assembly of the assembled screen units, but also a lighter display module formed by the assembled screen units assembled together.

In this embodiment, the frame 2 is divided into a first sub-portion 21 and a second sub-portion 22, and a relatively thick second vibration isolation portion 5 is provided between the second sub-portion 22 close to the central region 101 of the display panel 1 and the display panel 1, so that the vibration first transmitted to the second border region S2 when the central region 101 of the display panel 1 is vibrated to produce sound is absorbed (i.e., the standing wave principle), and thus, the vibration transmission from the display panel 1 to the frame 2 is reduced. Meanwhile, the vibration transmission from the second border region S2 to the first border region S1 is reduced or avoided, so that an effective vibration radiation region of the display panel 1 is constrained within the second border region S2, and the vibration transmission to the first sub-portion 21 and the case 6 connected to the first sub-portion 21 is reduced or avoided, and finally, the possibility of vibration in the case 6 is reduced or avoided, so that the abnormal sound caused by vibration of the case 6 is reduced or avoided, and the screen sounding effect of the assembled screen unit is improved. In addition, by provision of the first vibration isolation portion 4, the vibration transmission from the display panel 1 in a current assembled screen unit to an adjacent assembled screen unit through the second border region S2 and the first border region S1, thereby improving the screen sounding effect of the screen formed by the assembled screen units assembled together.

Figure 5:
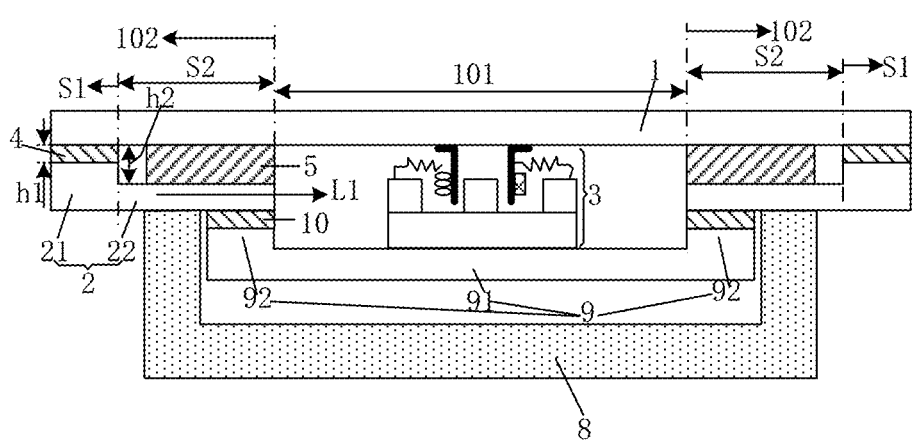
FIG. 5 is a schematic structural sectional view of an assembled screen unit according to an embodiment of the present disclosure.

In some embodiments, referring to FIG. 5, the second sub-portion 22 is formed by extending out from a side of the first sub-portion 21 close to the central region 101 of the display panel 1 in a direction L1 approaching the central region 101 of the display panel 1. A gap h2 between a side of the second sub-portion 22 close to the display panel 1 and the edge region 102 is greater than a gap h1 between the side of the first sub-portion 21 close to the display panel 1 and the edge region 102.

Figure 9A:
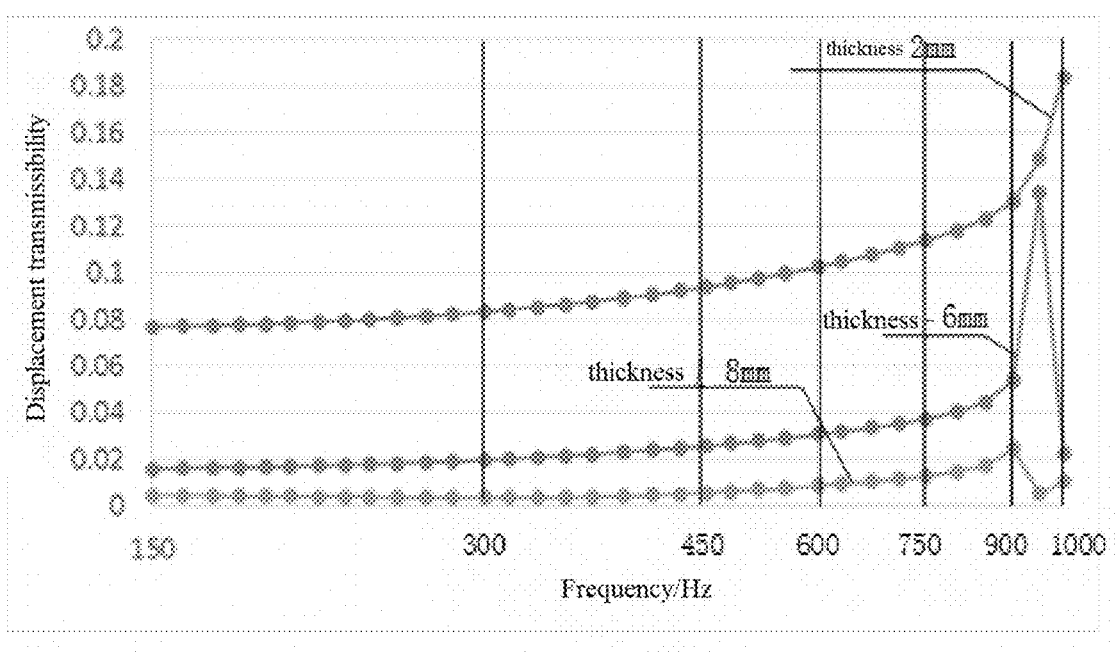
FIG. 9a is a graph illustrating a relationship of a vibration transmissibility of the second border region of the display panel and a thickness of the second vibration isolation portion.
Figure 9B:
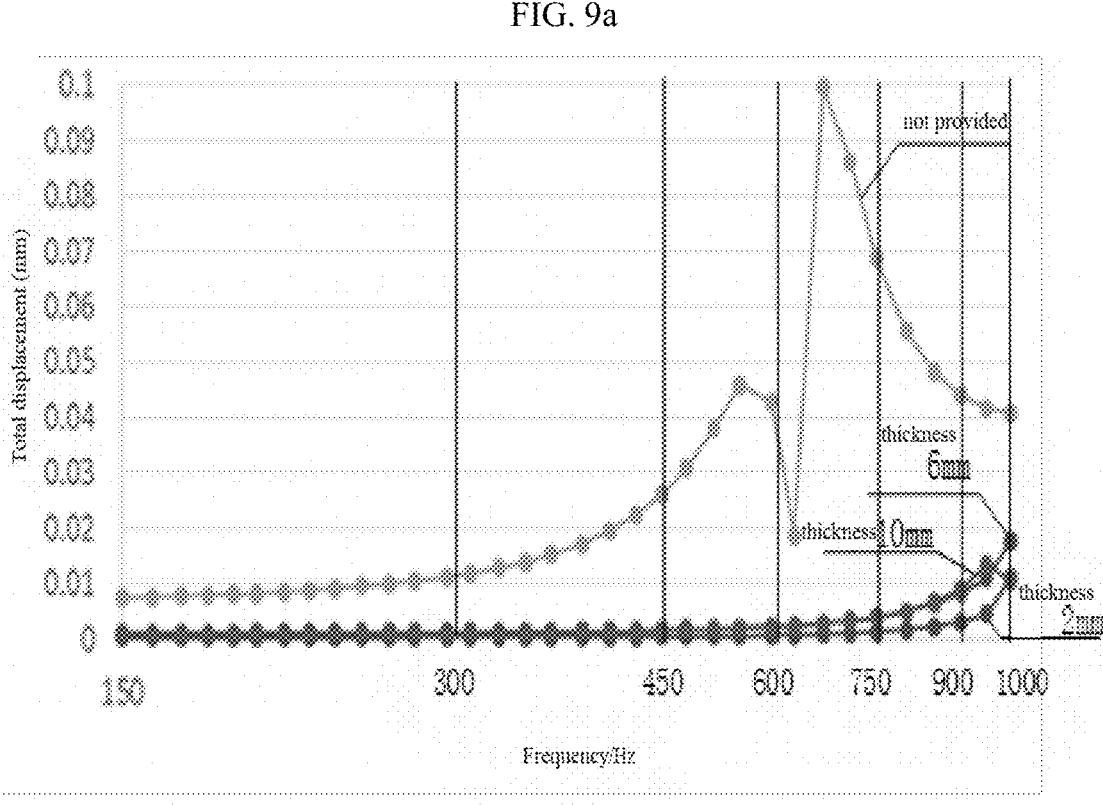
FIG. 9b is a graph illustrating a relationship of a total vibration displacement in the first border region of the display panel, absence and presence of the second vibration isolation portion, and different thicknesses of the second vibration isolation portion.
Figure 9C:
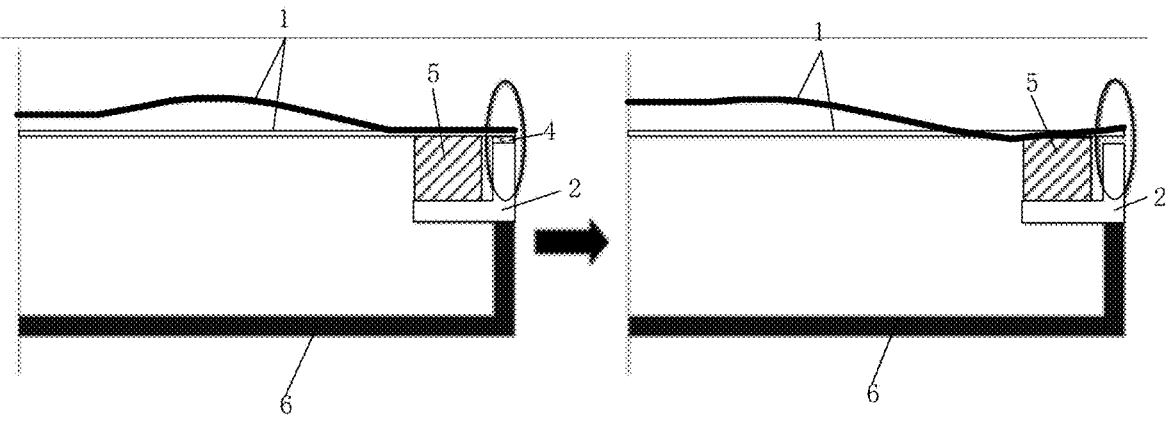
FIG. 9c is a schematic diagram showing vibration states in a first border region with and without a first vibration isolation portion.
Figure 9D:
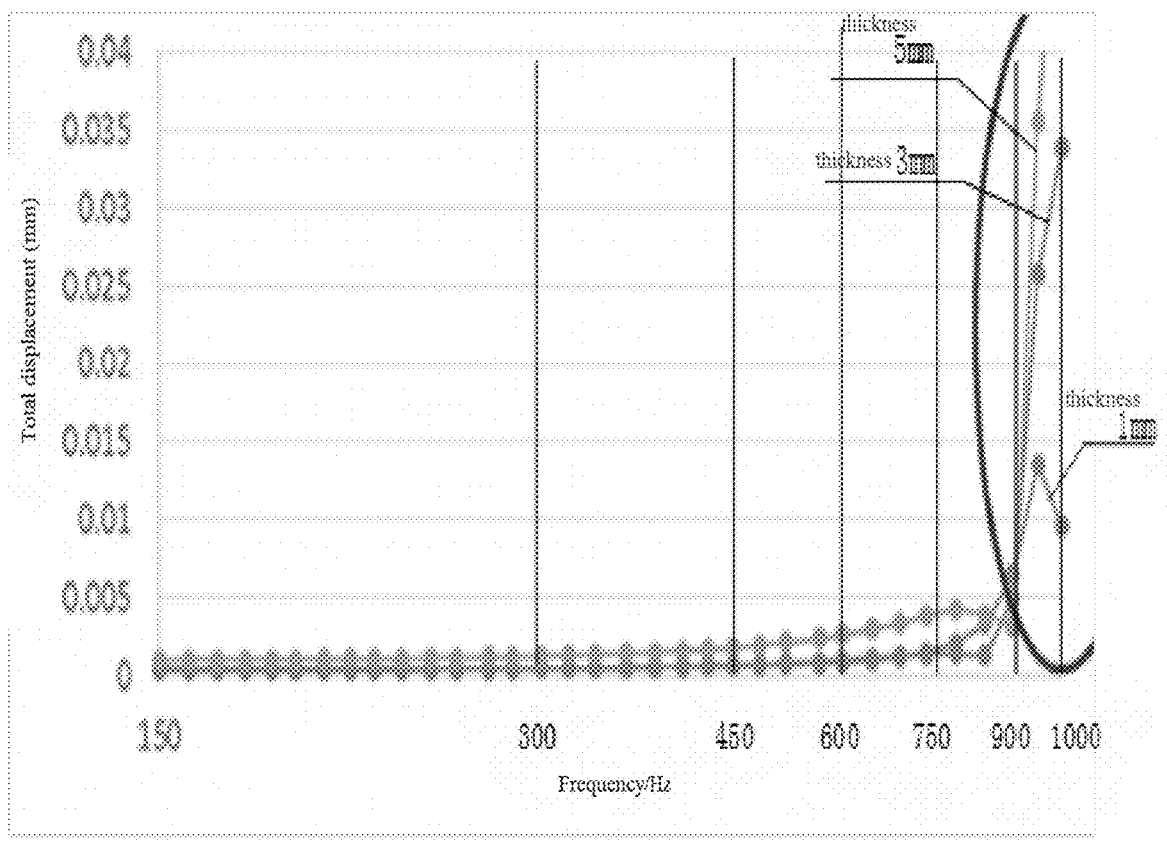
FIG. 9d is a graph illustrating changes in a total vibration displacement in the first border region as a function of a thickness of the first vibration isolation portion.

The gap h2 between the side of the second sub-portion 22 close to the display panel 1 and the edge region 102 is filled by the second vibration isolation portion 5. The gap h1 between the side of the first sub-portion 21 close to the display panel 1 and the edge region 102 is filled by the first vibration isolation portion 4. The second vibration isolation portion 5 can absorb vibration in the second border region S2 of the display panel 1, which can reduce the vibration transmission from the second border region S2 of the display panel 1 to the frame 2. Referring to FIG. 9a, a graph illustrating a relationship of a vibration transmissibility of the second border region S2 of the display panel 1 and a thickness of the second vibration isolation portion 5 is shown. As can be seen from FIG. 9a, the vibration transmissibility of the second border region S2 of the display panel 1 is inversely related to the thickness of the second vibration isolation portion 5, which can further reduce the vibration transmission from the second border region S2 of the display panel 1 to the first border region S1. Referring to FIG. 9b, a graph illustrating a relationship of a total vibration displacement in the first border region S1 of the display panel 1, absence and presence of the second vibration isolation portion 5, and different thicknesses of the second vibration isolation portion 5 is shown. As can be seen from FIG. 9b, the provision of the second vibration isolation portion 5 can significantly reduce vibration in the first border region S1, but the vibration isolation effect of the first vibration isolation portion 4 is relatively independent of the thickness thereof. The first vibration isolation portion 4 in the first border region S1 mainly functions to suppress the vibration transmission from the display panel 1 of a current assembled screen unit to the display panel 1 of an adjacent assembled screen unit. Referring to FIG. 9c, vibration states of the first border region S1 with and without the first vibration isolation portion 4 are shown, where the vibration in the first border region S1 is larger when without the first vibration isolation portion 4, and thus, transmission of displacement to the adjacent display panel 1 is also larger. FIG. 9d is a graph illustrating changes in a vibration transmissibility in the first border region S1 as a function of a thickness of the first vibration isolation portion 4. As can be seen from FIG. 9d, a thinner first vibration isolation portion 4 leads to a smaller total vibration displacement in the first border region S1. In the above FIG. 9a, the vibration transmissibility is characterized by a displacement transmissibility of vibration of the display panel 1. Therefore, by providing the gap h2 between the second sub-portion 22 and the display panel 1 greater than the gap h1 between the first sub-portion 21 and the display panel 1, a maximum vibration reduction effect can be achieved.

In some embodiments, referring to FIG. 5, a thickness of the second vibration isolation portion 5 is less than a sum of thicknesses of the first vibration isolation portion 4 and the first sub-portion 21. In other words, the thickness of the second vibration isolation portion 5 is equal to a sum of the thickness of the first vibration isolation portion 4 and a gap difference between the gap h2 and the gap h1. A thicker second vibration isolation portion 5 may lead to a better vibration absorption effect, i.e., a better vibration isolation effect. Meanwhile, since the flatness of the display panel 1 is still determined by the first vibration isolation portion 4, a thicker second vibration isolation portion 5 will not affect the overall flatness of the display panel 1 when the assembled screen units are assembled, and therefore, the vibration isolation scheme in the embodiment is suitable for applications such as assembled screens with high requirements on flatness.

Figure 10:
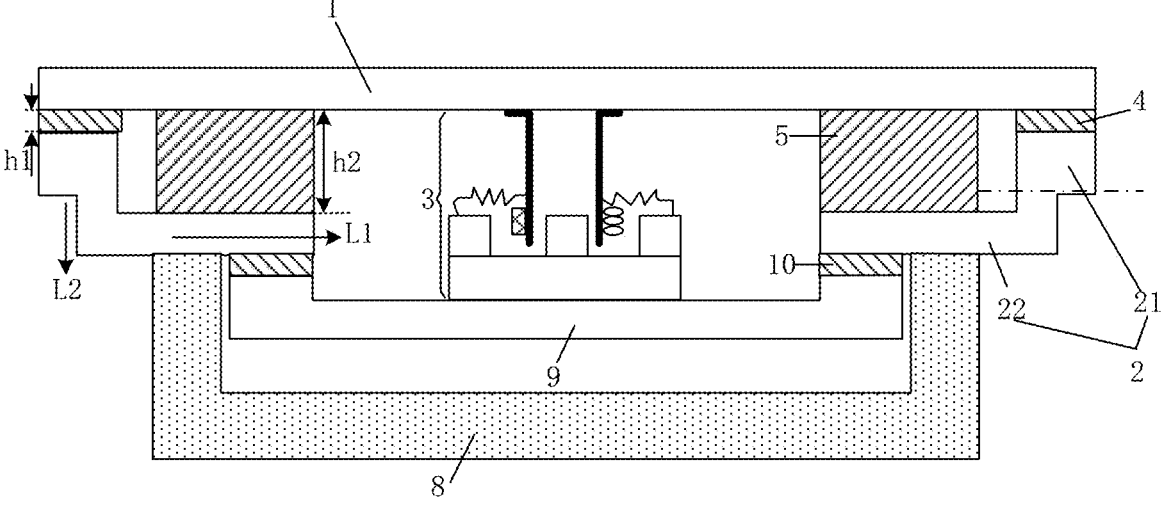
FIG. 10 is a schematic structural sectional view of yet another assembled screen unit according to an embodiment of the present disclosure.

In some embodiments, referring to FIG. 10, the second sub-portion 22 is formed by extending out from a side of the first sub-portion 21 close to the central region 101 of the display panel 1 first in a direction L1 approaching the central region 101 of the display panel 1, then in a direction L2 away from the display panel 1, and then in a direction L1 approaching the central region 101 of the display panel 1. A gap h2 between a side of the second sub-portion 22 close to the display panel 1 and the edge region 102 is greater than a gap h1 between the side of the first sub-portion 21 close to the display panel 1 and the edge region 102.

In some embodiments, referring to FIG. 10, a thickness of the second vibration isolation portion 5 is greater than a sum of thicknesses of the first vibration isolation portion 4 and the first sub-portion 21. The thickness of the second vibration isolation portion 5 is a sum of the thickness of the first vibration isolation portion 4, the thickness of the first sub-portion 21, and a distance of the first sub-portion 21 extending in the direction L2 away from the display panel 1. By provision of the second vibration isolation portion 5 with such a thickness, the vibration absorption effect, and thus the vibration isolation effect, can be further improved without affecting the overall flatness of the display panel 1 when the assembled screen units are assembled.

Figure 11:
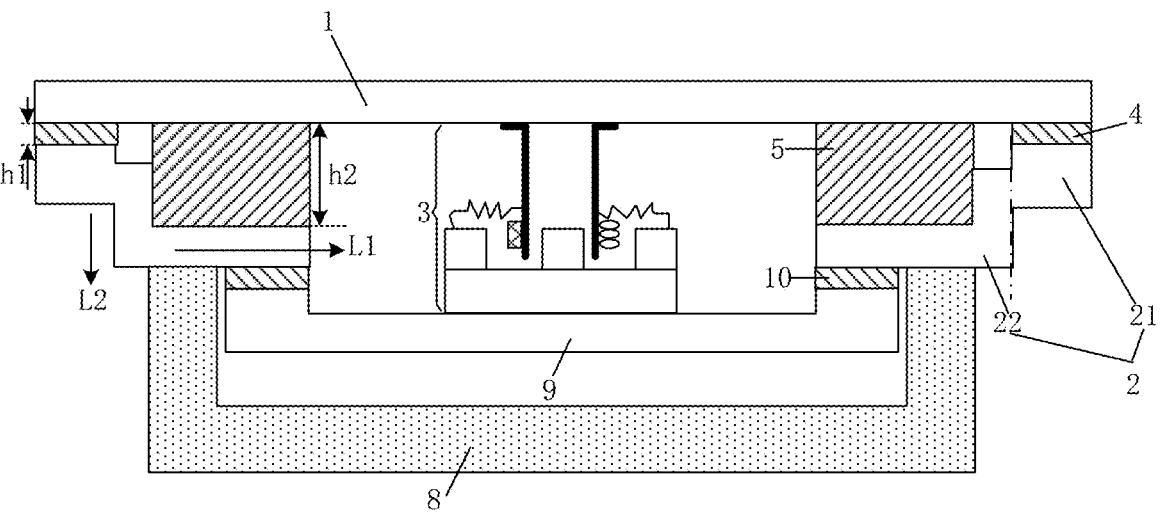
FIG. 11 is a schematic structural sectional view of yet another assembled screen unit according to an embodiment of the present disclosure.

In some embodiments, referring to FIG. 11, the second sub-portion 22 is formed by extending out from a side of the first sub-portion 21 facing away from the display panel 1 first in a direction L2 away from the display panel 1, and then in a direction L1 approaching the central region 101 of the display panel 1. A gap h2 between a side of the second sub-portion 22 close to the display panel 1 and the edge region 102 is greater than a gap h1 between the side of the first sub-portion 21 close to the display panel 1 and the edge region 102.

In some embodiments, referring to FIG. 11, a thickness of the second vibration isolation portion 5 is greater than a sum of thicknesses of the first vibration isolation portion 4 and the first sub-portion 21. The thickness of the second vibration isolation portion 5 is a sum of the thickness of the first vibration isolation portion 4, the thickness of the first sub-portion 21, and a distance of the first sub-portion 21 extending in the direction L2 away from the display panel 1. By provision of the second vibration isolation portion 5 with such a thickness, the vibration absorption effect, and thus the vibration isolation effect, can be further improved without affecting the overall flatness of the display panel 1 when the assembled screen units are assembled.

In some embodiments, the thickness of the second vibration isolation portion may be equal to a sum of thicknesses of the first vibration isolation portion and the first sub-portion.

In some embodiments, referring to FIGS. 5, 7, 10 and 11, the first sub-portion 21 partially extends outwardly to form the second sub-portion 22, while the thickness of the first sub-portion 21 remains unchanged, and the case 6 is connected to the first sub-portion 21. Therefore, the structural arrangement of the first sub-portion 21 and the second sub-portion 22 in FIGS. 5, 7 and 10 will not increase an overall thickness of the assembled screen unit formed by fastening the display panel 1 and the case 6.

Figure 12:
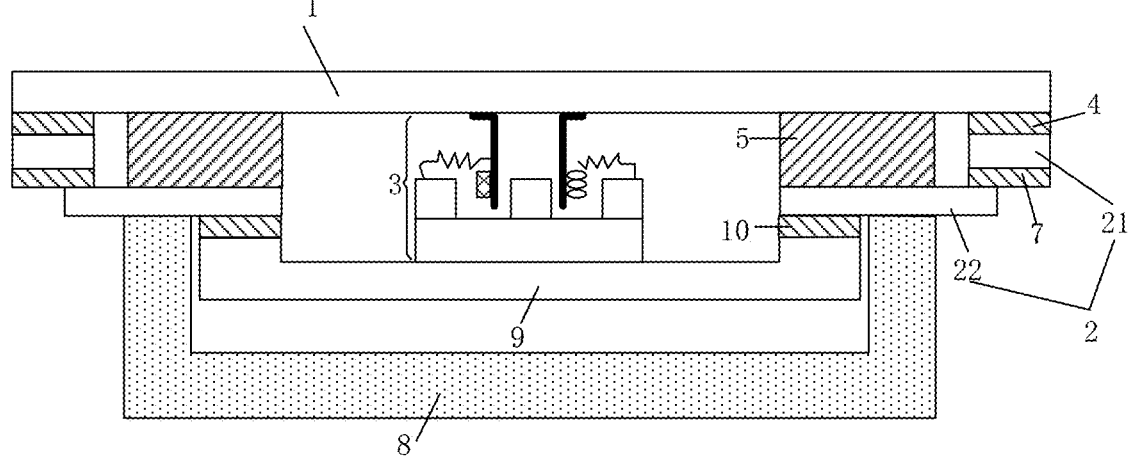
FIG. 12 is a schematic structural sectional view of yet another assembled screen unit according to an embodiment of the present disclosure.

In some embodiments, referring to FIG. 12, the second sub-portion 22 is located on a side of the first sub-portion 21 facing away from the display panel 1. The orthographic projections of the second sub-portion 22 and the first sub-portion 21 on the back side of the display panel 1 are partially overlapped. The second sub-portion 22 and the first sub-portion 21 are connected with each other at an overlap position of the orthographic projections. A third vibration isolation portion 7 is further provided between the second sub-portion 22 and the first sub-portion 21. By provision of the third vibration isolation portion 7, the vibration transmission from the display panel 1 to the first sub-portion 21 and the case 6 connected to the first sub-portion 21 can be further reduced or avoided, and thus, the possibility of vibration in the case 6, as well as the abnormal sound caused by vibration of the case 6, can be further reduced or avoided.

In some embodiments, since the vibration reached the central region is significantly reduced or blocked after being transmitted successively through the second vibration isolation portion 5 and the first vibration isolation portion 4, the vibration transmitted to the third vibration isolation portion 7 is far less than the vibration transmitted to the second vibration isolation portion 5, and such that the third vibration isolation portion 7 has a thickness less than the second vibration isolation portion 5. In some embodiments, it is also possible that the third vibration isolation portion 7 has a thickness greater than or equal to the second vibration isolation portion 5. Specifically, the thickness of the third vibration isolation portion 7 is set based on the magnitude of vibration that can be blocked by the third vibration isolation portion.

In some embodiments, referring to FIG. 12, the thickness of the second vibration isolation portion 5 is equal to a sum of thicknesses of the first vibration isolation portion 4, the first sub-portion 21, and the third vibration isolation portion 7.

In some embodiments, referring to FIGS. 5 and 7 to 12, the first vibration isolation portion 4 is separated from the second vibration isolation portion 5 by a gap of 1 mm or more. The gap between the first vibration isolation portion 4 and the second vibration isolation portion 5 is a gap between sides of the first vibration isolation portion 4 and the second vibration isolation portion 5 close to each other in a direction L1 in which the edge region 102 gets away from the central region 101. In this manner, the vibration transmission from the display panel 1 can be better blocked, and the vibration transmission to the first sub-portion 21 and the case 6 can be reduced or avoided. In addition, this gap can be used to place a control wire for controlling sound production of the sound-production stimulation unit 3, so that the preparation process of the assembled screen unit can be simplified, and the integration level of the display module formed by a plurality of assembled screen units assembled together is increased.

Figure 13:
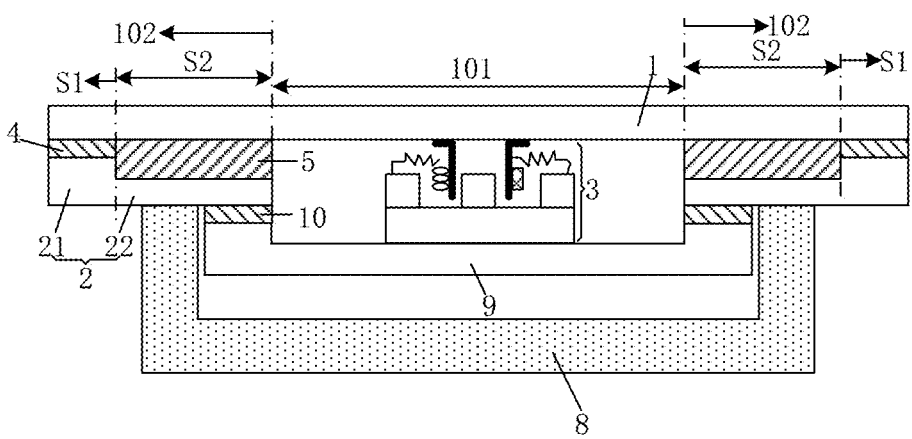
FIG. 13 is a schematic structural sectional view of yet another assembled screen unit according to an embodiment of the present disclosure.

In some embodiments, referring to FIG. 13, the first vibration isolation portion 4 and the second vibration isolation portion 5 are in contact with each other to form an integral structure. In this manner, in the case that the second vibration isolation portion 5 has a certain thickness, it is possible to better block the vibration transmission from the display panel 1, and reduce or avoid the vibration transmission to the first sub-portion 21 and the case 6.

Figure 14A:
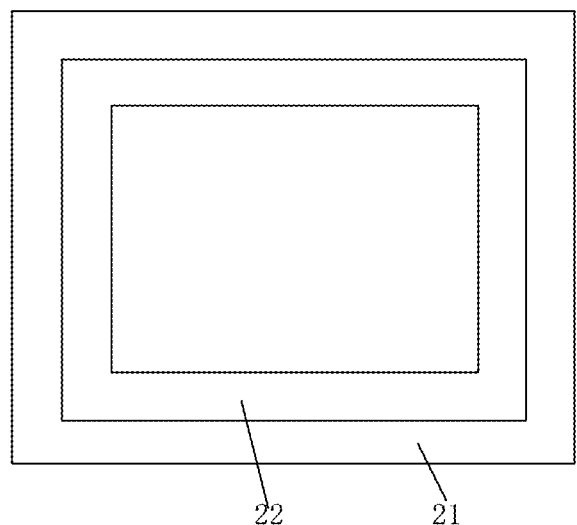
FIG. 14a is a schematic structural top view of a frame according to an embodiment of the present disclosure.
Figure 14B:
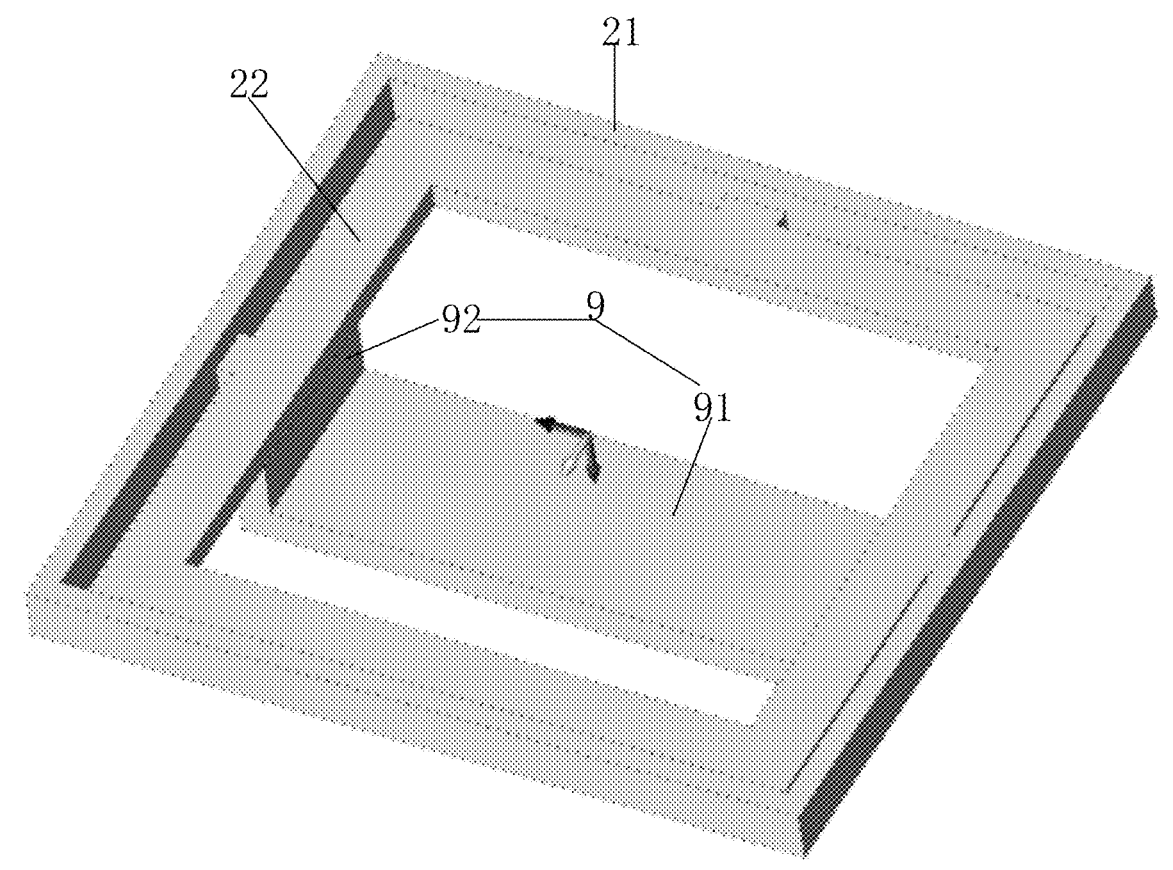
FIG. 14b is a schematic structural diagram of a frame and a supporting structure according to an embodiment of the present disclosure.

In some embodiments, referring to FIGS. 14a and 14b, an orthographic projection of the first sub-portion 21 on the back side of the display panel 1 forms a first closed loop. An orthographic projection of the second sub-portion 22 on the back side of the display panel 1 forms a second closed loop. The second closed loop surrounds a periphery of the central region of the display panel 1. The first closed loop surrounds a periphery of the second closed loop. The second closed loop is fully abutted against the first closed loop. In other words, full-face connection is provided between the first sub-portion 21 and the second sub-portion 22.

Figure 15A:
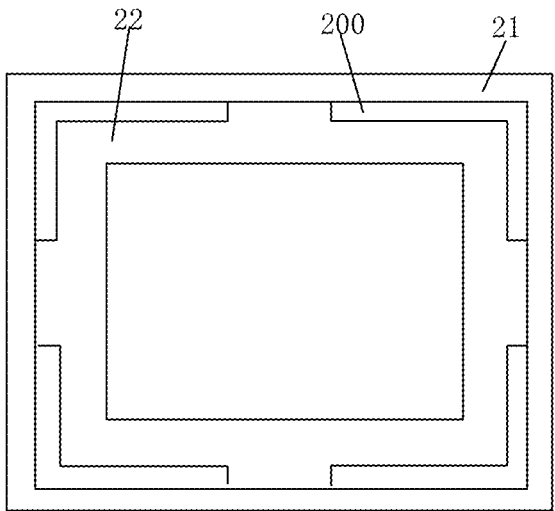
FIG. 15a is a schematic structural top view of another frame according to an embodiment of the present disclosure.
Figure 15B:
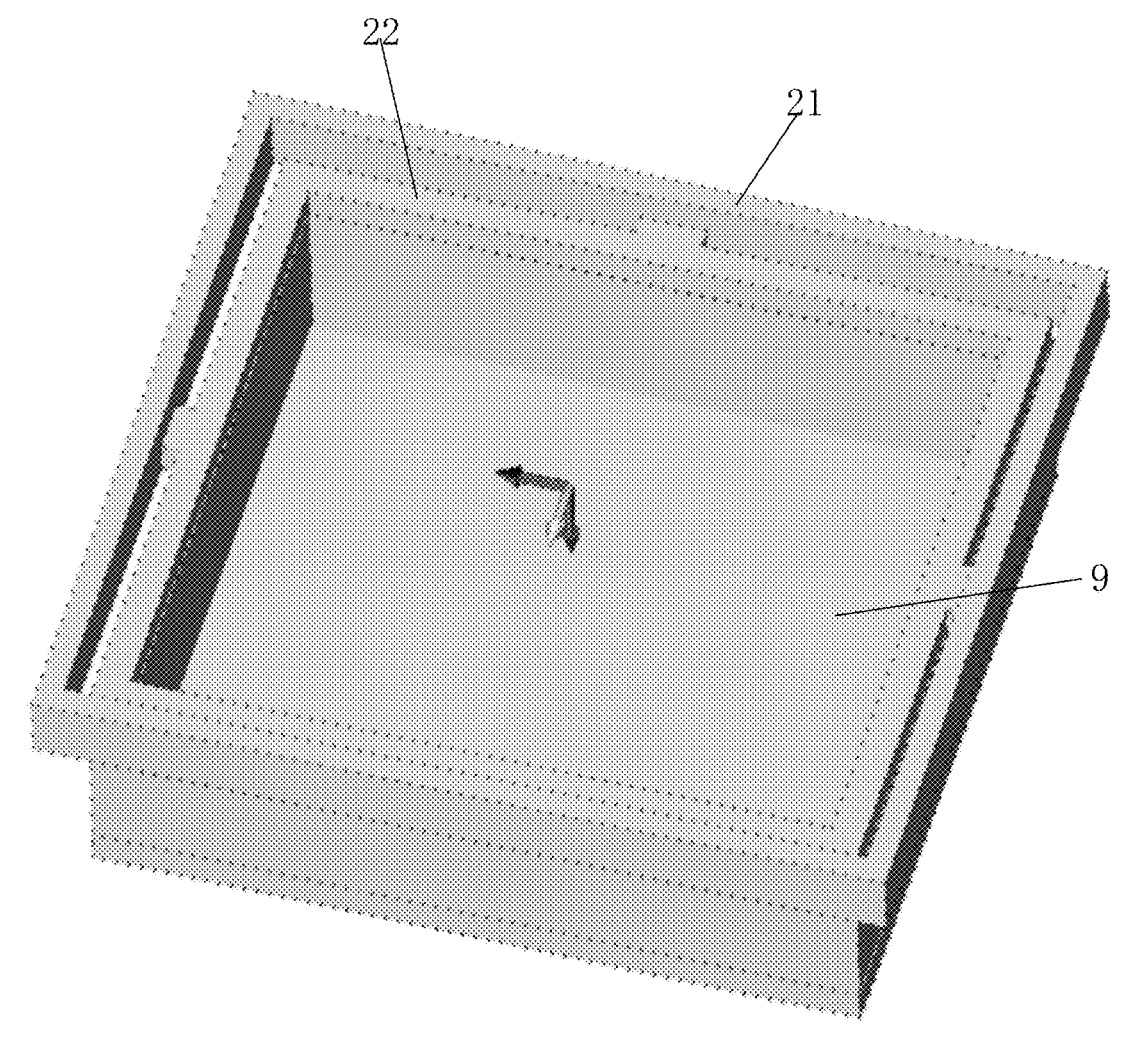
FIG. 15b is a schematic structural diagram of another frame and another supporting structure according to an embodiment of the present disclosure.

In some embodiments, referring to FIGS. 15a and 15b, the second closed loop is abutted against the first closed loop at peripheral local positions, and a hollowed-out region 200 is formed in a non-abutted peripheral region between the second closed loop and the first closed loop. In other words, beam connection (i.e., non-full-face connection) is provided between the first sub-portion 21 and the second sub-portion 22, so that the vibration transmitted from the central region to the second sub-portion 22 can be transmitted through the beam only, which can further reduce or avoid the vibration transmitted from the second sub-portion 22 to the first sub-portion 21.

In some embodiments, the first vibration isolation portion 4, the second vibration isolation portion 5, and the third vibration isolation portion 7 each use a vibration isolation double-sided tape. The vibration isolation double-sided tape includes foam or rubber. The foam includes, for example, a PU foam (insulating ester foam) or an EVA foam (ethylene-vinyl acetate copolymer). A thicker vibration isolation double-sided tape will bring about a better vibration isolation effect.

In some embodiments, a vibration frequency of the display panel 1 is greater than $\sqrt{2}$ times of a natural frequency of the second vibration isolation portion 5. In this manner, the vibration transmissibility from the display panel 1 to the second sub-portion 22 is less than 1, so that the second vibration isolation portion 5 can well block the vibration transmission from the display panel 1 to the second sub-portion 22 and the first sub-portion 21 in sequence.

In some embodiments, referring to FIGS. 5 to 11, the assembled screen unit further includes an acoustic cavity 8 on a side of the frame 2 facing away from the display panel 1. The acoustic cavity 8 is connected to the second sub-portion 22. The acoustic cavity 8 is fastened to the back side of the display panel 1 in a closed manner. An orthographic projection of the acoustic cavity 8 on the back side of the display panel 1 covers the central region 101 of the display panel 1.

The acoustic cavity 8 is located in a cavity formed by the case 6 and the display panel 1 fastened together. The central region 101 of the display panel 1 is an effective radiation region of vibration, and length and width dimensions of the acoustic cavity 8 cover the effective radiation region of vibration. When the display panel 1 is vibrated to produce sound, the vibration of the effective radiation region pushes only air in the acoustic cavity 8 to vibrate without influencing the air in the case 6, thereby solving the original problem of sound stain caused by the case 6. In addition, a closed cavity is formed between the acoustic cavity 8 and the display panel 1, which can prevent low-frequency sound short circuit and increase low-frequency loudness: where the specific principle is as follows: sound waves at the back side of the display panel 1 are diffracted to the front side, and since the sound waves at the front side and the back side of the display panel 1 have opposite phases, destructive interference is generated, thereby preventing low-frequency sound short circuit.

In some embodiments, the acoustic cavity 8 is made of wood or plexiglass.

In some embodiments, referring to FIGS. 5 to 12, the supporting structure 9 is connected to the second sub-portion 22 through a fourth vibration isolation portion 10; and the fourth vibration isolation portion 10 is located between the supporting structure 9 and the second sub-portion 22.

The supporting structure 9 is connected to the second sub-portion 22 by a locking screw. The supporting structure 9 is configured to fix the sound-production stimulation unit 3, so that only the voice coil drives the display panel 1 to vibrate under the driving of an electromagnetic force of the sound-production stimulation unit 3, while the basin stand and the magnet are kept still, thereby improving the sound quality. By provision of the fourth vibration isolation portion 10, the vibration transmission from the supporting structure 9 to the second sub-portion 22 can be reduced. The fourth vibration isolation portion 10 uses a vibration isolation double-sided tape.

In some embodiments, referring to FIGS. 14b and 5 to 12, the supporting structure 9 includes a main body portion 91 and a connecting portion 92. The main body portion 91 has a strip-shaped structure, and the connecting portion 92 is connected to the second sub-portion 22 on opposite sides. A width of the main body portion 91 is smaller than a width of the central region 101 of the display panel 1 in this width direction. The supporting structure 9 is located in a cavity formed by the acoustic cavity 8 and the display panel 1 fastened together.

In some embodiments, referring to FIGS. 14b and 5 to 12, both the acoustic cavity 8 and the supporting structure 9 are located in a cavity formed by the case 6 and the display panel 1 fastened together.

Figure 16:
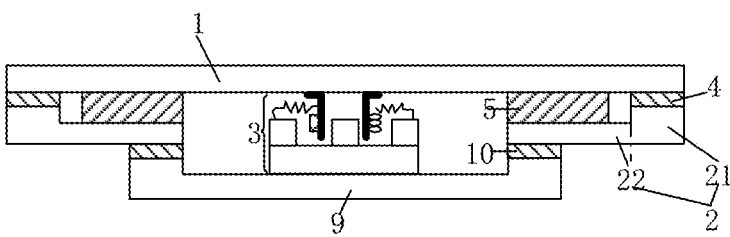
FIG. 16 is a schematic structural sectional view of yet another assembled screen unit according to an embodiment of the present disclosure.
Figure 17:
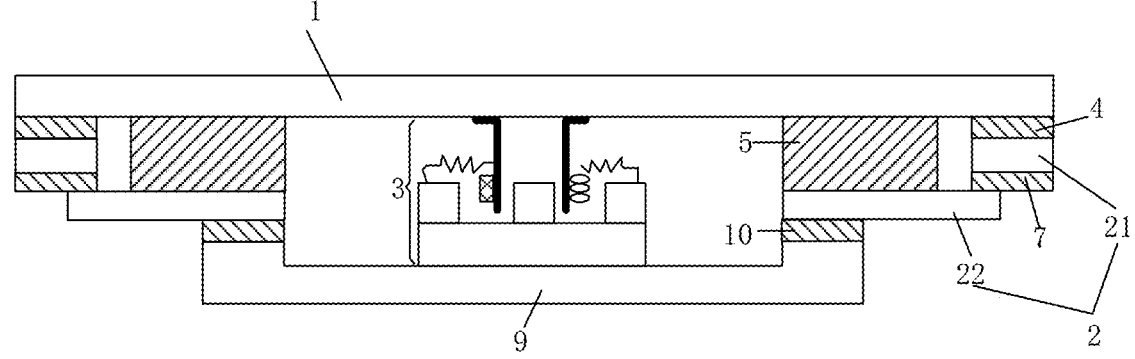
FIG. 17 is a schematic structural sectional view of yet another assembled screen unit according to an embodiment of the present disclosure.

In some embodiments, referring to FIGS. 15b, 16 and 17, the supporting structure 9) is fastened to the back side of the display panel 1 in a closed manner. The supporting structure 9 is reused as an acoustic cavity. That is, the supporting structure 9 may be made of wood or plexiglass. Due to the provision of the closed supporting structure 9, the acoustic cavity in the assembled screen unit can be omitted. In this way, an overall thickness of the assembled screen unit can be reduced.

In some embodiments, referring to FIGS. 15b, 16 and 17, the supporting structure 9 is connected to the second sub-portion 22 through a fourth vibration isolation portion 10. The fourth vibration isolation portion 10 is located between the supporting structure 9 and the second sub-portion 22. The supporting structure 9 is located in a cavity formed by the case 6 and the display panel 1 fastened together.

In some embodiments, the display panel 1 may be an LCD display panel, an OLED display panel, a Mini LED display panel, or a Micro LED display panel. Preferably, the display panel 1 is a Mini LED display panel or a Micro LED display panel, so that a plurality of assembled screen units can be assembled into a display module in an optimized manner, while better sound and image coincidence of the display module can be achieved.

According to the assembled screen unit in the embodiments of the present disclosure, the frame is divided into a first sub-portion and a second sub-portion, and a relatively thick second vibration isolation portion is provided between the second sub-portion close to the central region and the display panel, so that the vibration first transmitted to the second border region when the central region is vibrated to produce sound is absorbed (i.e., the standing wave principle), the vibration transmission from the second border region S2 to the first border region S1 is reduced or avoided, thereby an effective vibration radiation region of the display panel is constrained within the second border region, the vibration transmission to the first sub-portion and the case connected to the first sub-portion is reduced or avoided, and finally, the possibility of vibration in the case is reduced or avoided, so that the abnormal sound caused by vibration of the case is reduced or avoided, and the screen sounding effect of the assembled screen unit is improved.

An embodiment of the present disclosure further provides a display module, including a plurality of assembled screen units as described in the above embodiments, where the plurality of assembled screen units are assembled with each other.

By adopting the assembled screen unit in the above embodiments, the screen sounding effect of the display module is improved.

The display module may be: an LED panel, an LED television, a mobile phone, a tablet, a monitor, a laptop, a digital album, a navigator or any other product or component having a display function.

It will be appreciated that the above implementations are merely exemplary implementations for the purpose of illustrating the principle of the present disclosure, and the present disclosure is not limited thereto. It will be apparent to one of ordinary skill in the art that various modifications and variations may be made without departing from the spirit or essence of the present disclosure. Such modifications and variations should also be considered as falling into the protection scope of the present disclosure.

What is claimed is:

1. An assembled screen unit, comprising a display panel, a frame, a sound-production stimulation unit, and a supporting structure, wherein the frame, the sound-production stimulation unit, and the supporting structure are located on a back side of the display panel;

the supporting structure is located on a side of the sound-production stimulation unit away from the display panel, and the supporting structure is configured to support the sound-production stimulation unit;

the back side of the display panel comprises a central region and an edge region;

the sound-production stimulation unit is in contact with the central region, and the sound-production stimulation unit is configured to stimulate vibration of the display panel to produce sound; and an orthographic projection of the frame on the back side of the display panel is located in the edge region, and the frame is configured to support the display panel;

wherein the frame comprises a first sub-portion and a second sub-portion, and an orthographic projection of the second sub-portion on the back side of the display panel is closer to the central region than an orthographic projection of the first sub-portion on the back side of the display panel;

a first vibration isolation portion is provided between the first sub-portion and the display panel; a second vibration isolation portion is provided between the second sub-portion and the display panel; and the first vibration isolation portion has a thickness less than the second vibration isolation portion;

wherein the second sub-portion is located on a side of the first sub-portion facing away from the display panel, the orthographic projections of the second sub-portion and the first sub-portion on the back side of the display panel are partially overlapped, and the second sub-portion and the first sub-portion are connected with each other at an overlap position of the orthographic projections of the second sub-portion and the first sub-portion; and a third vibration isolation portion is further provided between the second sub-portion and the first sub-portion.

2. The assembled screen unit according to claim 1, wherein a thickness of the second vibration isolation portion is equal to a sum of thicknesses of the first vibration isolation portion, the first sub-portion, and the third vibration isolation portion.

3. The assembled screen unit according to claim 1, wherein the first vibration isolation portion is separated from the second vibration isolation portion by a gap of 1 mm or more;

or, the first vibration isolation portion and the second vibration isolation portion are in contact with each other to form an integral structure.

4. The assembled screen unit according to claim 1, wherein the orthographic projection of the first sub-portion on the back side of the display panel forms a first closed loop;

the orthographic projection of the second sub-portion on the back side of the display panel forms a second closed loop;

the second closed loop surrounds a periphery of the central region; the first closed loop surrounds a periphery of the second closed loop;

the second closed loop is fully abutted against the first closed loop;

or, the second closed loop is abutted against the first closed loop at peripheral local positions, and a hollowed-out region is formed in a non-abutted peripheral region between the second closed loop and the first closed loop.

5. The assembled screen unit according to claim 1, wherein a vibration frequency of the display panel is greater than $\sqrt{2}$ times of a natural frequency of the second vibration isolation portion.

6. The assembled screen unit according to claim 1, further comprising an acoustic cavity on a side of the frame facing away from the display panel, and the acoustic cavity is connected to the second sub-portion; wherein the acoustic cavity is fastened to the back side of the display panel in a closed manner, and an orthographic projection of the acoustic cavity on the back side of the display panel covers the central region.

7. The assembled screen unit according to claim 1, wherein the supporting structure is fastened to the back side of the display panel in a closed manner; and the supporting structure is reused as an acoustic cavity.

8. The assembled screen unit according to claim 6, wherein the supporting structure is connected to the second sub-portion through a fourth vibration isolation portion; and the fourth vibration isolation portion is located between the supporting structure and the second sub-portion.

9. The assembled screen unit according to claim 7, wherein the supporting structure is connected to the second sub-portion through a fourth vibration isolation portion; and the fourth vibration isolation portion is located between the supporting structure and the second sub-portion.

10. The assembled screen unit according to claim 8, wherein the supporting structure comprises a main body portion and a connecting portion, the main body portion has a strip-shaped structure, and the connecting portion is connected to the second sub-portion;

a width of the main body portion is smaller than a width of the central region in that width direction of the main body portion; and the supporting structure is located in a cavity formed by the acoustic cavity and the display panel fastened together.

11. The assembled screen unit according to claim 8, further comprising a case on a side of the frame facing away from the display panel, the case is connected to a side of the first sub-portion facing away from the display panel, and the case is fastened to the back side of the display panel in a closed manner; wherein both the acoustic cavity and the supporting structure are located in a cavity formed by the case and the display panel fastened together.

12. The assembled screen unit according to claim 9, further comprising a case on a side of the frame facing away from the display panel, the case is connected to a side of the first sub-portion facing away from the display panel, and the case is fastened to the back side of the display panel in a closed manner; wherein the supporting structure is located in a cavity formed by the case and the display panel fastened together.

13. A display module, comprising a plurality of assembled screen units according to claim 1, wherein the plurality of assembled screen units are assembled with each other.

14. An assembled screen unit, comprising a display panel, a frame, a sound-production stimulation unit, a supporting structure and an acoustic cavity, wherein the frame, the sound-production stimulation unit, and the supporting structure are located on a back side of the display panel;

the supporting structure is located on a side of the sound-production stimulation unit away from the display panel, and the supporting structure is configured to support the sound-production stimulation unit;

the back side of the display panel comprises a central region and an edge region;

the sound-production stimulation unit is in contact with the central region, and the sound-production stimulation unit is configured to stimulate vibration of the display panel to produce sound; and an orthographic projection of the frame on the back side of the display panel is located in the edge region, and the frame is configured to support the display panel;

wherein the frame comprises a first sub-portion and a second sub-portion, and an orthographic projection of the second sub-portion on the back side of the display panel is closer to the central region than an orthographic projection of the first sub-portion on the back side of the display panel;

a first vibration isolation portion is provided between the first sub-portion and the display panel; a second vibration isolation portion is provided between the second sub-portion and the display panel; and the first vibration isolation portion has a thickness less than the second vibration isolation portion;

wherein the second sub-portion is formed by extending out from a side of the first sub-portion close to the central region in a direction approaching the central region; and a gap between a side of the second sub-portion close to the display panel and the edge region is greater than a gap between the side of the first sub-portion close to the display panel and the edge region;

wherein the acoustic cavity is located on a side of the frame facing away from the display panel, and the acoustic cavity is connected to the second sub-portion; and the acoustic cavity is fastened to the back side of the display panel in a closed manner, and an orthographic projection of the acoustic cavity on the back side of the display panel covers the central region.

15. The assembled screen unit according to claim 14, wherein the first vibration isolation portion is separated from the second vibration isolation portion by a gap of 1 mm or more;

or, the first vibration isolation portion and the second vibration isolation portion are in contact with each other to form an integral structure.

16. The assembled screen unit according to claim 14, wherein the orthographic projection of the first sub-portion on the back side of the display panel forms a first closed loop;

the orthographic projection of the second sub-portion on the back side of the display panel forms a second closed loop;

the second closed loop surrounds a periphery of the central region; the first closed loop surrounds a periphery of the second closed loop;

the second closed loop is fully abutted against the first closed loop;

or, the second closed loop is abutted against the first closed loop at peripheral local positions, and a hollowed-out region is formed in a non-abutted peripheral region between the second closed loop and the first closed loop.

17. The assembled screen unit according to claim 14, wherein a vibration frequency of the display panel is greater than $\sqrt{2}$ times of a natural frequency of the second vibration isolation portion.

18. The assembled screen unit according to claim 14, wherein the supporting structure is connected to the second sub-portion through a fourth vibration isolation portion; and the fourth vibration isolation portion is located between the supporting structure and the second sub-portion.

19. The assembled screen unit according to claim 18, wherein the supporting structure comprises a main body portion and a connecting portion, the main body portion has a strip-shaped structure, and the connecting portion is connected to the second sub-portion;

a width of the main body portion is smaller than a width of the central region in that width direction of the main body portion; and the supporting structure is located in a cavity formed by the acoustic cavity and the display panel fastened together.

20. The assembled screen unit according to claim 18, further comprising a case on a side of the frame facing away from the display panel, the case is connected to a side of the first sub-portion facing away from the display panel, and the case is fastened to the back side of the display panel in a closed manner; wherein both the acoustic cavity and the supporting structure are located in a cavity formed by the case and the display panel fastened together.

* * * * *